(12) United States Patent
Xu et al.

(10) Patent No.: US 12,535,742 B2
(45) Date of Patent: Jan. 27, 2026

(54) METHOD AND APPARATUS FOR CORRECTING PROXIMITY EFFECT OF ELECTRON BEAM

(71) Applicant: INSTITUTE OF MICROELECTRONICS, CHINESE ACADEMY OF SCIENCES, Beijing (CN)

(72) Inventors: Jian Xu, Beijing (CN); Yayi Wei, Beijing (CN); Shang Yang, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 903 days.

(21) Appl. No.: 17/784,064

(22) PCT Filed: Dec. 29, 2021

(86) PCT No.: PCT/CN2021/142262
§ 371 (c)(1),
(2) Date: Mar. 30, 2023

(87) PCT Pub. No.: WO2023/045161
PCT Pub. Date: Mar. 30, 2023

(65) Prior Publication Data
US 2024/0184217 A1    Jun. 6, 2024

(30) Foreign Application Priority Data
Sep. 23, 2021  (CN) .......................... 202111113529.0

(51) Int. Cl.
*G03F 7/00* (2006.01)

(52) U.S. Cl.
CPC ...... *G03F 7/70558* (2013.01); *G03F 7/70391* (2013.01); *G03F 7/70516* (2013.01)

(58) Field of Classification Search
CPC ............. G03F 7/70558; G03F 7/70391; G03F 7/70516; G03F 7/2061
(Continued)

(56) References Cited

U.S. PATENT DOCUMENTS 5,241,185 A      8/1993  Meiri et al.
2006/0284119 A1 12/2006  Kurokawa
(Continued)

FOREIGN PATENT DOCUMENTS

CN   111965936 A   11/2020
CN   113835307 A   12/2021

OTHER PUBLICATIONS

International Search Report and Written Opinion in PCT/CN2021/142262.
(Continued)

*Primary Examiner* — Caleen O Sullivan
(74) *Attorney, Agent, or Firm* — Goodwin Procter LLP

(57) ABSTRACT

A method and an apparatus for correcting a proximity effect of an electron beam. An initial dose of the electron beam is preset for each exposed square, and proximity effect energy representing an influence of exposing all exposed squares other than a current exposed square on the current exposed is calculated. A corrected dose of the electron beam for the current exposed square is then calculated, and the corrected dose for each exposed square in the electron beam exposure layout matrix is successively calculated. Then, the above calculation iterates for T times to obtain a final corrected dose of the electron beam for each exposed square.

10 Claims, 4 Drawing Sheets

(58) Field of Classification Search
USPC .......................................... 430/30, 296, 492
See application file for complete search history.

(56) References Cited

U.S. PATENT DOCUMENTS

| | | |
|---|---|---|
| 2008/0067446 A1 | 3/2008 | Belic et al. |
| 2014/0077103 A1* | 3/2014 | Matsumoto ......... H01J 37/3174 250/492.3 |
| 2014/0229904 A1* | 8/2014 | Fujimura .............. G03F 7/2063 716/54 |
| 2016/0180190 A1 | 6/2016 | Lifshin et al. |
| 2020/0133139 A1* | 4/2020 | Lo ......................... H01J 37/304 |

OTHER PUBLICATIONS

Le Ma et al., "Investigation of A New Method to Weigh the Data Used for OPC Model Calibration," IEEE Xplore, Dec. 22, 2020.
Zhengyu Zhao, "Study of Proximity Effect Correction in Electron-Beam Lithograph," China University of Petroleum, Master of Engineering Degree Thesis, May 1, 2011.

\* cited by examiner

METHOD AND APPARATUS FOR CORRECTING PROXIMITY EFFECT OF ELECTRON BEAM

This application the national phase of International Application No. PCT/CN2021/142262, titled "METHOD AND APPARATUS FOR CORRECTING PROXIMITY EFFECT OF ELECTRON BEAM," filed on Dec. 29, 2021, which claims priority to Chinese Patent Application No. 202111113529.0, titled "METHOD AND APPARATUS FOR CORRECTING PROXIMITY EFFECT OF ELECTRON BEAM," filed on Sep. 23, 2021 with the China National Intellectual Property Administration, which is incorporated herein by reference in its entirety.

FIELD

The present disclosure relates to the technical field of semiconductor manufacturing, and in particular to a method and an apparatus for correcting proximity effect of an electron beam.

BACKGROUND

At present, electron-beam direct-writing lithography is widely used in micro-nano processing. A proximity effect of an electron beam is growing dominant with a decreasing dimension of a pattern, which results in distortion of a final pattern in lithography. The proximity effect of an electron beam is mainly reflected in two aspects, namely, incident electrons subject to forward scattering due to atoms in a photoresist and scatter backward due to atoms in a substrate. Due to the proximity effect, energy of the incident electrons cannot be localized at a point of incidence, and has a transverse distribution within the photoresist. Thereby, energy distribution is not uniform in the designed pattern, and a part of energy flows out of the pattern.

SUMMARY

A method and an apparatus for correcting proximity effect of an electron beam are provided in embodiments of the present disclosure. An incident dose of an electron beam in different areas of a pattern are calibrated within few iterative calculations, such that deposited energy is identical throughout an exposed region in the pattern and greater than a threshold for development. The dose of the electron beam is optimized through fast calculation, and it is convenient to obtain a pattern on a photoresist without distortion.

According to a first aspect, a method for correcting a proximity effect of an electron beam is provided. The method includes: step 1, establishing a point spread function for energy distribution in a photoresist that is exposed to a unit dose of the electron beam; step 2, dividing a designed pattern through a grid to establish a pattern matrix for electron-beam exposure, where the pattern matrix includes squares having identical dimensions, each square that is exposed in the designed pattern corresponds to a pixel value equal to 1 in the pattern matrix, and each square that is not exposed in the designed pattern corresponds to a pixel value equal to 0 in the pattern matrix: step 3, determining, for each exposed square in the pattern matrix, an initial dose of the electron beam and an energy threshold; step 4, calculating proximity effect energy based on the point spread function and the initial dose of each exposed square, where the proximity effect energy represents an influence of exposing all exposed squares other than a current exposed square on energy deposition at the current exposed square; step 5, calculating a corrected dose of the electron beam for the current exposed square based on the proximity effect energy, the energy threshold, and the point spread function; step 6, repeating the step 4 and the step 5, to calculate the corrected dose of the electron beam for each exposed square in the pattern matrix; step 7, repeating the step 4 and the step 5 to calculate the corrected dose again for each exposed square, where in the step 7 the initial dose is replaced with the corrected dose obtained in the step 6 for each exposed square; and step 8, repeating the step 4 and the step 5 for T iterations to obtain a final corrected dose of the electron beam for each exposed square, where in the step 8 the corrected dose that is last obtained in the step 7 substitutes for the corrected dose that is previously obtained for each exposed square.

In the foregoing solution, the initial dose of the electron beam is preset for each exposed square in the grid. The proximity effect energy representing the influence of exposing all exposed squares other than the current exposed square on energy deposition at the current exposed square is calculated based on the initial dose and the point spread function. The corrected dose of the electron beam for the current exposed square is then calculated based on the proximity effect energy, the energy threshold, and the point spread function. The above two steps are repeated to calculate the corrected dose for each exposed square in the pattern matrix for electron-beam exposure. Then, for each exposed square, the updated corrected dose obtained in subsequent calculation substitutes for the corrected dose obtained in previous calculation or the initial dose, and the calculation is repeated for T times to obtain the final corrected dose of the electron beam. Central exposure energy formed by exposing the current exposed square directly to the electron beam is processed separately from the proximity effect energy at the current exposed square due to exposing surrounding exposed squares. Hence, an incident dose of the electron beam for the current exposed square may be directly calculated, simplifying computation in each step of optimizing iteration. The incident dose can be obtained with desired accuracy within few optimization iterations, and thereby an optimized dose of the electron beam is quickly solved.

In a specific embodiment, the step of establishing the point spread function for energy distribution in the photoresist that is exposed to the electron beam of the unit dose includes: using a double-Gaussian function model to establish the point spread function as $$PSF(r) = \frac{1}{1+\eta} * \left( \frac{1}{\pi * \sigma^2} * e^{-(\frac{r}{\sigma})^2} + \frac{\eta}{\pi * \beta^2} * e^{-(\frac{r}{\beta})^2} \right),$$

where PSF(r) satisfies a normalization condition that is $$\int_0^\infty PSF(r)dr = 1,$$

where $\sigma$ represents a forward scattering range of the electron beam, $\beta$ represents a backward scattering range of the electron beam, $\eta$ represents a ratio of energy of the backward scattering to energy of the forward scattering, r represents a distance between a center point of another square in the gridded pattern and a center point of the current exposed square, and PSF(r) represents the energy distribution in a square of which a center point has a distance r from the center point of the current exposed square in the pattern matrix. Thereby, the energy distribution induced by the incident electron beam in the photoresist can be described more accurately, and it is convenient to perform discretization through the grid.

In a specific embodiment, the step of dividing the designed pattern through the grid to establish the pattern matrix for electron-beam exposure includes, adjusting a dimension of the squares until a condition of $0.5 \leq PSF(0) < 1$ is satisfied in each exposed square, where PSF(0) represents a local value of the point spread function due to exposing said exposed square. Thereby, accuracy of calculation is guaranteed to a certain extent, and subsequent iterative calculation for an optimized incident dose is apt to converge.

In a specific embodiment, the step of calculating the proximity effect energy based on the point spread function and the initial dose of each exposed square, includes: calculating the proximity effect energy based on the point spread function and the initial dose of each exposed square through convolution:

$$E_{ab}^{near} = \sum_{\substack{1 \leq i \leq m, 1 \leq j \leq n; \\ j \neq b, if\ i=a; \\ i \neq a, if\ j=b}} D_{ij} * PSF_{ij}(r),$$

where $E_{ab}^{near}$ represents the proximity effect energy corresponding to the current exposed square that is positioned at row a and column b in the pattern matrix; $D_{ij}$ represents the initial dose or the corrected dose of the exposed square that is positioned at row i and column j in the pattern matrix; and $PSF_{ij}(r)$ represents a value of the point spread function at the current exposed square positioned at row a and column b due to exposing the exposed square positioned at row i and column j in the pattern matrix. Thereby, an influence of exposing the surrounding exposed squares on the energy deposition at the current exposed square can be obtained through simple calculation, and the proximity effect energy for each exposed square can be accurately obtained.

In an embodiment, the step of calculating the corrected dose of the electron beam for the current exposed square based on the proximity effect energy, the energy threshold, and the point spread function includes: calculating central exposure energy required at the current exposed square, based on the proximity effect energy and the energy threshold; and calculating the corrected dose for the current exposed square based on the central exposure energy and the point spread function. Thereby, the corrected dose of the electron beam for an exposed square can be quickly determined in each step of iteration.

In an embodiment, calculating central exposure energy required at the current exposed square based on the proximity effect energy and the energy threshold is based on:

$$E_{ab}^{core} = E_{ab}^{th} - E_{ab}^{near}$$

where $E_{ab}^{core}$ represents the central exposure energy required at the current exposed square positioned at row a and column b, and $E_{ab}^{th}$ represents the energy threshold. Thereby, the central exposure energy required at each exposed square can be accurately obtained in each step of iteration.

In a specific embodiment, the step of calculating the corrected dose for the current exposed square based on the central exposure energy and the point spread function is based on:

$$D_{ab} = E_{ab}^{core} / PSF_{ab}(0)$$

where $D_{ab}$ represents the corrected dose for the current exposed square positioned at row a and column b, and $PSF_{ab}(0)$ represents a local value of the point spread function of the current exposed square positioned at row a and column b, which is induced by exposing the current exposed square. Thereby, the corrected dose for each exposed square can be accurately obtained in each step of iteration.

In a specific embodiment, the step of repeating the step 4 and the step 5 for T iterations to obtain the final corrected dose of the electron beam for each exposed square further includes: after each iteration, calculating total deposited energy $E_{ab}^{opt}$ for each exposed square based on the corrected dose, the central exposure energy, and the proximity effect energy of said exposed square through an equation:

$$E_{ab}^{opt} = E_{ab}^{core} + E_{ab}^{near};$$

calculating a mean square error (MSE) of all exposed squares based on the total deposited energy of each exposed square and the energy threshold through an equation:

$$MSE = \frac{1}{m*n} * \sum_{1 \leq i \leq m, 1 \leq j \leq n} \left(E^{th} - E_{ij}^{opt}\right)^2;$$

determining whether the mean square error is less than a set error threshold; performing a next iteration by repeating the step 4 and the step 5, when it is determined that the mean square error is greater than or equal to the set error threshold; and not performing a next iteration and determining the corrected dose obtained in said iteration as the final corrected dose, when it is determined that the mean square error is less than the set error threshold. Thereby, error calculation is performed after each step of iteration, which ensures that the iterative optimization leads to a desired precision.

In a specific embodiment, the step of repeating the step 4 and the step 5 for T iterations to obtain the final corrected dose of the electron beam for each exposed square further includes: repeating the step 4 and the step 5 for T iterations to obtain the final corrected dose of the electron beam for each exposed square, where the fast Fourier transform is used to perform convolution under a condition of PSF(0)=0 each time the step 4 is performed. The convolution calculation is applied, and a value of the point spread function for the exposed square, which is currently calculated, due to its exposure is set to be zero. Thereby, the new point spread function model is established for the current exposed square, and it represents an influence of exposing each exposed square in the pattern matrix, other than the current exposed square, on energy deposition of the currently exposed square. That is, application of the new point spread function model considers only the influence of the proximity effect on energy deposition of the current exposed square when each exposed square, except the current one, are under exposure. Therefore, the new point spread function model and the pattern matrix for the electron-beam exposure are convoluted, such that the central exposure energy due to exposure of the current exposed square itself is separately processed from the proximity effect energy due to the influence of exposure of surrounding exposed squares on energy deposition of the current exposed square. The corrected dose of the electron beam required at the current exposed square may be directly calculated in a subsequent process. In addition, the fast Fourier transform is advantageous in performing the convolution, and hence a contribution in energy from surrounding squares to energy deposition at the current square can be quickly obtained.

According a second aspect, an apparatus for correcting a proximity effect of an electron beam is provided. The apparatus includes a point-spread-function establishing module, a gridding module, an electron-beam initial-dose setting module, an energy-threshold determining module, a proximity-effect-energy calculating module, an electron-beam corrected-dose calculating module, and an electron-beam corrected-dose substituting module. The point-spread-function establishing module is configured to establish a point spread function for energy distribution in a photoresist that is exposed to a unit dose of the electron beam. The gridding module is configured to divide a designed pattern through a grid to establish a pattern matrix for electron-beam exposure, where the pattern matrix includes squares having identical dimensions, each square that is exposed in the designed pattern corresponds to a pixel value equal to 1 in the pattern matrix, and each square that is not exposed in the designed pattern corresponds to a pixel value equal to 0 in the pattern matrix. The electron-beam initial-dose setting module is configured to determine an initial dose of the electron beam for each exposed square in the pattern matrix. The energy-threshold determining module configured to determine an energy threshold for each exposed square in the pattern matrix. The proximity-effect energy calculating module is configured to calculate proximity effect energy based on the point spread function and the initial dose of each exposed square, where the proximity effect energy represents an influence of exposing all exposed squares other than a current exposed square on energy deposition at the current exposed square. The electron-beam corrected-dose calculating module is configured to: calculate a corrected dose of the electron beam for the current exposed square based on the proximity effect energy, the energy threshold, and the point spread function; and calculate the corrected dose of the electron beam for each exposed square in the pattern matrix in coordination with the proximity-effect energy calculating module. The electron-beam corrected-dose substituting module is configured to substitute, for each exposed square, a corrected dose that is newly obtained for the initial dose or the corrected dose that is previously obtained. The electron-beam corrected-dose calculating module is further configured to perform calculation for T iterations, in coordination with the proximity-effect energy calculating module, to obtain a final corrected dose of the electron beam for each exposed square.

In the foregoing solution, the initial dose of the electron beam is preset for each exposed square in the grid. The proximity effect energy representing the influence of exposing all exposed squares other than the current exposed square on energy deposition at the current exposed square is calculated based on the initial dose and the point spread function. The corrected dose of the electron beam for the current exposed square is then calculated based on the proximity effect energy, the energy threshold, and the point spread function. The above two steps are repeated to calculate the corrected dose for each exposed square in the pattern matrix for electron-beam exposure. Then, for each exposed square, the updated corrected dose obtained in subsequent calculation substitutes for the corrected dose obtained in previous calculation or the initial dose, and the calculation is repeated for T times to obtain the final corrected dose of the electron beam. Central exposure energy formed by exposing the current exposed square directly to the electron beam is processed separately from the proximity effect energy at the current exposed square due to exposing surrounding exposed squares. Hence, an incident dose of the electron beam for the current exposed square may be directly calculated, simplifying computation in each step of optimizing iteration. The incident dose can be obtained with desired accuracy within few optimization iterations, and thereby an optimized dose of the electron beam is quickly solved.

DETAILED DESCRIPTION

In order to clarify, objectives, technical solutions, and advantages of embodiments of the present disclosure, hereinafter technical solutions in embodiments of the present disclosure are described clearly and completely in conjunction with the drawings in embodiments of the present closure. Apparently, the described embodiments are only some rather than all of the embodiments of the present disclosure. Any other embodiments obtained based on the embodiments of the present disclosure by those skilled in the art without any creative effort fall within the scope of protection of the present disclosure.

In order to facilitate understanding of the method for correcting a proximity effect of an electron beam according to embodiments of the present disclosure, the method according to embodiments of the present disclosure is described in conjunction with an application scenario of electron-beam direct-writing technology, and specifically of lithography transferring a designed pattern onto a photoresist. Hereinafter the method is described in detail with reference to the drawings.

Figure 1:
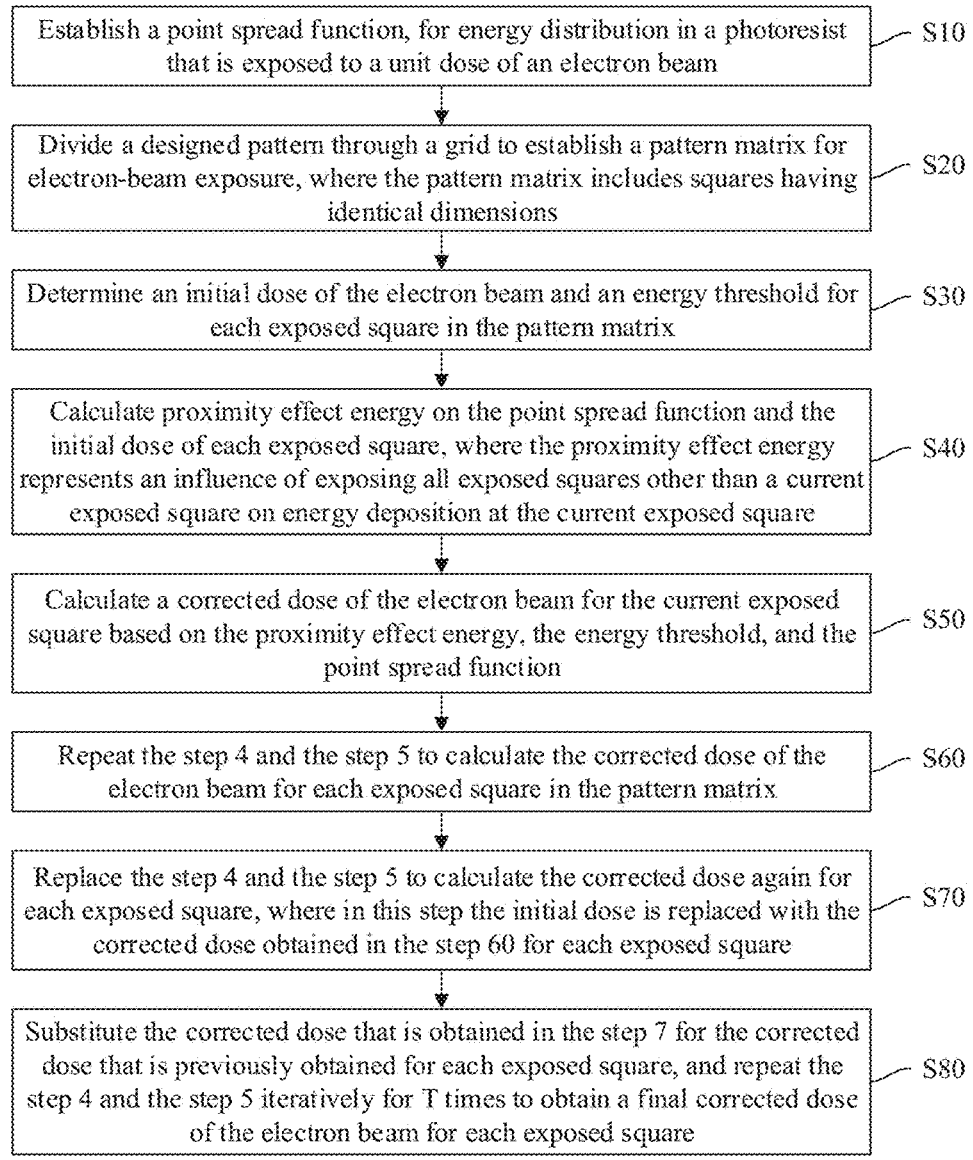
FIG. 1 is a flowchart of a method for correcting a proximity effect of an electron beam according to an embodiment of the present disclosure.

Reference is made to FIG. 1. The method for correcting a proximity effect of an electron beam includes steps 10 to 80.

In step 10, a point spread function, for energy distribution in a photoresist that is exposed to a unit dose of the electron beam, is established.

In step 20, a designed pattern is divided through a grid to establish a pattern matrix for electron-beam exposure, where the pattern matrix includes squares having identical dimensions. Each square that is exposed in the designed pattern corresponds to a pixel value equal to 1 in the pattern matrix. Each square that is not exposed in the designed pattern corresponds to a pixel value equal to 0 in the pattern matrix.

In step 30, an initial dose of the electron beam and an energy threshold are determined for each exposed square in the pattern matrix.

In step 40, proximity effect energy is calculated based on the point spread function and the initial dose of each exposed square. The proximity effect energy represents an influence of exposing all exposed squares other than a current exposed square on energy deposition at the current exposed square.

In step 50, a corrected dose of the electron beam is calculated for the current exposed square based on the proximity effect energy, the energy threshold, and the point spread function.

In step 60, the step 4 and the step 5 are repeated to calculate the corrected dose of the electron beam for each exposed square in the pattern matrix.

In step 70, the step 4 and the step 5 are repeated to calculate the corrected dose again for each exposed square. In this step, the initial dose is replaced with the corrected dose obtained in the step 60 for each exposed square.

In step 80, the corrected dose that is obtained in the step 7 substitutes for the corrected dose that is previously obtained for each exposed square, and the step 4 and the step 5 are iteratively repeated for T times to obtain a final corrected dose of the electron beam for each exposed square.

In the foregoing solution, the initial dose of the electron beam is preset for each exposed square in the grid. The proximity effect energy representing the influence of exposing all exposed squares other than the current exposed square on energy deposition at the current exposed square is calculated based on the initial dose and the point spread function. The corrected dose of the electron beam for the current exposed square is then calculated based on the proximity effect energy, the energy threshold, and the point spread function. The above two steps are repeated to calculate the corrected dose for each exposed square in the pattern matrix for electron-beam exposure. Then, for each exposed square, the updated corrected dose obtained in subsequent calculation substitutes for the corrected dose obtained in previous calculation or the initial dose, and the calculation is repeated for T times to obtain the final corrected dose of the electron beam. Central exposure energy formed by exposing the current exposed square directly to the electron beam is processed separately from the proximity effect energy at the current exposed square due to exposing surrounding exposed squares. Hence, an incident dose of the electron beam for the current exposed square may be directly calculated, simplifying computation in each step of optimizing iteration. The incident dose can be obtained with desired accuracy within few optimization iterations, and thereby an optimized dose of the electron beam is quickly solved. Hereinafter the foregoing steps are described in detail with reference to the drawings.

Reference is made to FIG. 1. Established is the point spread function for energy distribution in the photoresist that is exposed to the electron beam of the unit dose. As an example, a double-Gaussian function model may be used to establish the point spread function as follows.

$$PSF(r) = \frac{1}{1+\eta} * \left( \frac{1}{\pi * \sigma^2} * e^{-(\frac{r}{\sigma})^2} + \frac{\eta}{\pi * \beta^2} * e^{-(\frac{r}{\beta})^2} \right),$$

PSF(r) satisfies a normalization condition as follows.

$\int_0^\infty PSF(r)dr = 1.$

Figure 4:
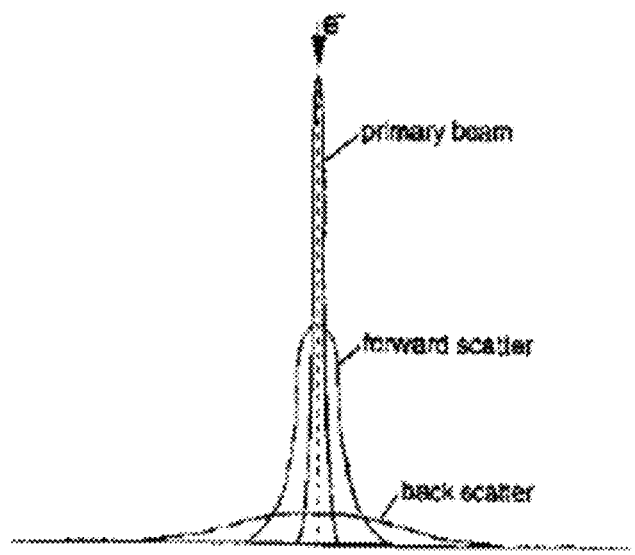
FIG. 4 is a schematic diagram of a range of forward scattering and backward scattering.

FIG. 4 shows a graph for an electron scattering effect, where the "primary beam" represents a curve of major energy distribution of an electron beam. It can be seen that energy of the electron beam is substantially concentrated. The "forward scatter" represents a curve for forward scattering of the electron beam. In the above function, α represents a range of the forward scattering, generally with a unit of um. σ indicates a dimension of the range of the forward scattering of the electron beam. The "backscatter" represents a curve for backward scattering of the electron beam. In the above function, β represents a range influenced by the backward scattering, generally with a unit of um. β indicates a size of the range of the backward scattering of the electron beam. In the above function, η represents a ratio of energy of the backward scattering to energy of the forward scattering, r represents a distance between a center point of another square in the gridded pattern and a center point of the current exposed square, PSF(r) represents the energy distribution in a square of which a center point has a distance r from the center point of the current exposed square in the pattern matrix. It can be seen that an exposed square that is closer to the center point of the current exposed square has a larger density of energy deposition, and an exposed square that is farther away from the center point of the current exposed square has a smaller density of energy deposition. Based on the forgoing double-Gaussian function model, influences of the forward scattering and the backward scattering of the electron beam are taken into account. Thereby, the energy distribution induced by the incident electron beam in the photoresist can be described more accurately, and it is convenient to perform discretization through the grid.

It should be noted that establishment of the point spread function is not limited to the foregoing double-Gaussian function model, and other function models may be utilized as the point spread function for characterizing the energy distribution of the incident electron beam in the photoresist. Similarly, the point spread function of another type of may be subject to subsequent grid discretization and corrected-dose calculation which are described hereinafter.

Figure 2:
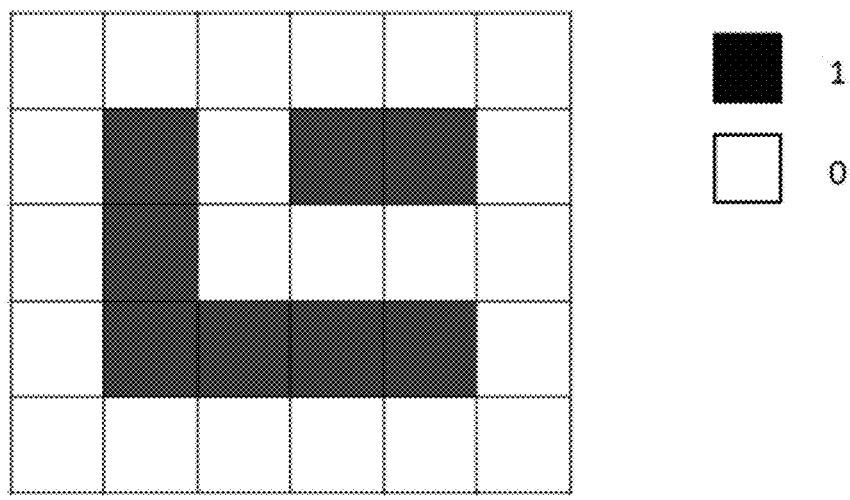
FIG. 2 is a schematic diagram of a pattern matrix for electron-beam exposure according to an embodiment of the present disclosure.

As shown in FIG. 2, a designed pattern is gridded (divided through a grid) to establish a pattern-matrix for electron-beam exposure, which include squares having identical dimensions. In the pattern matrix, each square that is exposed (that is for exposure) in the designed pattern corresponds to a pixel value equal to 1, and each square that is not exposed (that is not for exposure) in the designed pattern corresponds to a pixel value equal to 0.

When determining a dimension of each square, the dimension may be increased such that each exposed square owns at least a half of the energy due to exposing itself to the unit dose. For example, the dimension of the squares is adjusted until a condition of 0.5≤PSF(0)<1 is satisfied in each exposed square, and herein PSF(0) represents a local value of the point spread function due to exposing each exposed square. As an example, the dimension of the squares may be adjusted such that the local value of the point spread function due to exposing each exposed square is equal to a value greater than or equal to 0.5 and smaller than 1, and the value is, for example, 0.5, 0.55, 0.60, 0.65, 0.70, 0.80, 0.90. Thereby, accuracy of calculation is guaranteed to a certain extent, and subsequent iterative calculation for an optimized incident dose is apt to converge. In an embodiment, the designed pattern may be divided in advance through a grid including squares of a certain dimension, and then the energy distribution is calculated for each exposed square. In a case that PSF(0) is not greater than or equal to 0.5, the dimension is increased to achieve more energy locally distributed in each exposed square. The above process is repeated until PSF(0) of the point spread function satisfies the above condition at each exposed square.

As shown in FIG. 1, the initial dose of the electron beam and the energy threshold are determined for each exposed square in the pattern matrix. The initial dose of the electron beam may be identically configured for all exposed squares in the pattern matrix. Alternatively, different exposed squares in the pattern matrix may be configured to have different initial doses. Alternatively, a part of the exposed squares is configured to have identical initial doses, and another part of exposed squares is configured to have different initial doses. In comparison, the determined energy threshold should be identical for all exposed squares, which serves as a target of optimization. Thereby, the pattern transferred onto the photoresist may be obtained without distortion when electron beam lithography is performed with the final determined corrected doses of the electron beam.

Reference is further made to FIG. 1. The proximity effect energy is calculated based on the point spread function and the initial dose of each exposed square, and the proximity effect energy represents an influence of exposing all exposed squares other than a current exposed square on energy deposition at the current exposed square. As an example, the proximity effect energy may be calculated based on the point spread function and the initial dose of each exposed square through convolution.

$$E_{ab}^{near} = \sum_{\substack{1 \le i \le m, 1 \le j \le n; \\ j \ne b, if \ i=a; \\ i \ne a, if \ j=b}} D_{ij} * PSF_{ij}(r)$$

$E_{ab}^{near}$ represents the proximity effect energy corresponding to the current exposed square that is positioned at row a and column b in the pattern matrix. $D_{ij}$ represents the initial dose or the corrected dose of the exposed square that is positioned at row i and column j in the pattern matrix. $PSF_{ij}(r)$ represents a value of the point spread function at the current exposed square positioned at row a and column b due to exposing the exposed square positioned at row i and column j in the pattern matrix. Thereby, an influence of exposing the surrounding exposed squares on the energy deposition at the current exposed square can be obtained through simple calculation, and the proximity effect energy for each exposed square can be accurately obtained.

As an example, it may be assumed that the PSF(0)=0 for the current exposed square, and only the influence of exposing the other exposed squares (the current exposed square not included) on energy deposition is considered for the current exposed square. The foregoing equation, which calculates a sum, is applied to obtain the proximity effect energy $E_{ab}^{near}$ that referents the influence of exposing all exposed squares, other than the current exposed square, on energy deposition at the current exposed square. The energy deposition at the current exposed square due to direct incidence of the electron beam, i.e. exposing the current exposed square, is obtained in subsequent calculation.

As shown in FIG. 1, the corrected dose of the electron beam for the current exposed square is calculated based on the proximity effect energy, the energy threshold, and the point spread function. As an example, central exposure energy required at the current exposed square may be first calculated based on the proximity effect energy and the energy threshold. Then, the corrected dose for the current exposed square is calculated based on the central exposure energy and the point spread function. Thereby, the corrected dose of the electron beam for an exposed square can be quickly determined in each step of iteration.

The central exposure energy required at the current exposed square may be calculated based on the proximity effect energy and the energy threshold through a following equation.

$$E_{ab}^{core} = E_{ab}^{th} - E_{ab}^{near}$$

$E_{ab}^{core}$ represents the central exposure energy required at the current exposed square positioned at row a and column b, and $E_{ab}^{th}$ represents the energy threshold. Thereby, the central exposure energy required at each exposed square can be accurately obtained in each step of iteration.

The corrected dose for the current exposed square may be calculated based on the central exposure energy and the point spread function through a following equation.

$$D_{ab} = E_{ab}^{core} / PSF_{ab}(0)$$

$D_{ab}$ represents the corrected dose for the current exposed square positioned at row a and column b. $PSF_{ab}(0)$ represents a local value of the point spread function of the current exposed square positioned at row a and column b, which is induced by exposing the current exposed square. Thereby, the corrected dose for each exposed square can be accurately obtained in each step of iteration.

Reference is further made to FIG. 1. The corrected dose that is obtained in the step 7 substitutes for the corrected dose that is previously obtained for each exposed square. The step 4 and the step 5 are iteratively repeated for T times to obtain a final corrected dose of the electron beam for each exposed square.

As an example, the quantity T of iterations may be determined as follows. After each iteration, total deposited energy $E_{ab}^{opt}$ is calculated for each exposed square based on the corrected dose, the central exposure energy, and the new proximity effect energy of said exposed square through a following equation.

$$E_{ab}^{opt} = E_{ab}^{core} + E_{ab}^{near}.$$

Then, a mean square error (MSE) of all exposed squares is calculated based on the total deposited energy of each exposed square and the energy threshold through a following equation.

$$MSE = \frac{1}{m*n} * \sum_{1 \le i \le m, 1 \le j \le n} \left(E^{th} - E_{ij}^{opt}\right)^2$$

Figure 3:
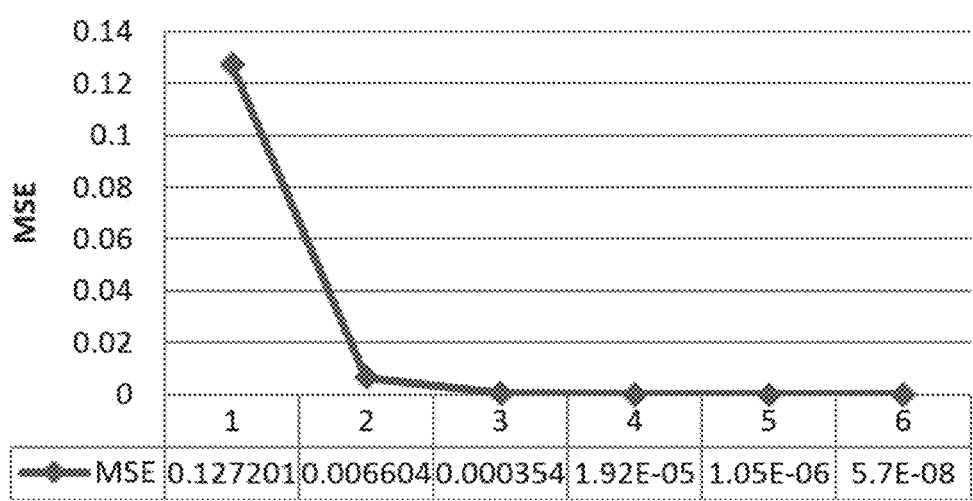
FIG. 3 is a schematic graph of a mean square error with respect to a quantity of iterations according to an embodiment of the present disclosure.
Figure 7:
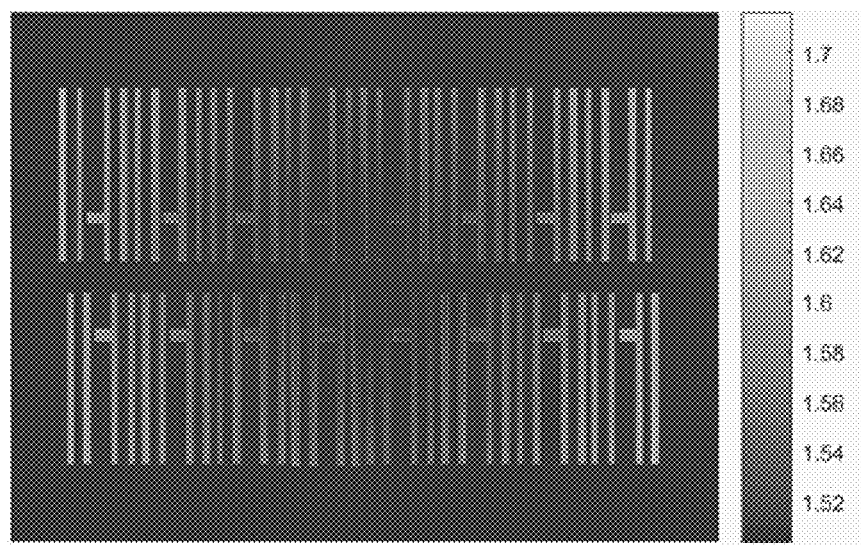
FIG. 7 is a schematic diagram of distribution of a corrected dose of an electron beam according to an embodiment of the present disclosure.

Afterwards, it is determined whether the mean square error is less than a set error threshold. Thereby, it is determined whether there is a next iteration based on a relationship between the mean square error after each iteration and the set error threshold, or there is no next iteration and the final corrected dose of the electron beam is outputted for each exposed square. As an example, in a case that it is determined that the mean square error is greater than or equal to the set error threshold, the step 4 and step 5 are repeated again to perform the next iteration. In a case that it is determined that the mean square error is less than the set error threshold, the iterative process is terminated and the corrected dose obtained in the current iteration serves as the final corrected dose for each exposed square. Thereby, error calculation is performed after each step of iteration, which ensures that the iterative optimization leads to a desired precision. FIG. 3 is a graph showing the mean square error after each step of iteration in a process including six iterations. As can be seen from FIG. 3, the mean square error keeps decreasing with an increase of the quantity of iterations, thereby approaching the a desired precision. The curve of the mean square error with respect to the quantity of iterations gradually converges toward zero, and the mean square error is quite low after three iterations according to the forgoing solution. Hence, embodiments of the present disclosure can achieve an ideal precision using few iterations. FIG. 7 is a schematic diagram of a distribution of a corrected dose of the electron beam after using the correcting method according to an embodiment of the present disclosure. In a designed pattern, the central region is subject to a stronger proximity effect caused by adjacent pattern elements due to a high density of pattern elements. Therefore, the central region is assigned with lower corrected dose of the electron beam (indicated by dark shade in FIG. 7). The peripheral region in the design patter is subject to a weaker proximity effect caused by adjacent patterns due to a low density of pattern elements. Therefore, the central region is assigned with higher corrected dose (indicated by shallow shade in FIG. 7). Thereby, the final energy deposition is uniformly distributed throughout the pattern on the photoresist.

In addition, the step 80 further includes a following step. The step 4 and the step 5 are iteratively repeated for T times to obtain the final corrected dose of the electron beam for each exposed square, where the fast Fourier transform is used to perform convolution under a condition of PSF(0)=0 each time the step 4 is performed. The convolution calculation is applied, and a value of the point spread function for the exposed square, which is currently calculated, due to its exposure is set to be zero. Thereby, the new point spread function model is established for the current exposed square, and it represents an influence of exposing each exposed square in the pattern matrix, other than the current exposed square, on energy deposition at the currently exposed square. That is, application of the new point spread function model considers only the influence of the proximity effect on energy deposition at the current exposed square when each exposed square, except the current one, are under exposure. Therefore, the new point spread function model and the pattern matrix for the electron-beam exposure are convoluted, such that the central exposure energy due to exposure of the current exposed square itself is separately processed from the proximity effect energy due to the influence of exposure of surrounding exposed squares on energy deposition at the current exposed square. The corrected dose of the electron beam required at the current exposed square may be directly calculated in a subsequent process. In addition, the fast Fourier transform is advantageous in performing the convolution, and hence a contribution in energy from surrounding squares to energy deposition at an arbitrary current square can be quickly obtained.

Figure 5:
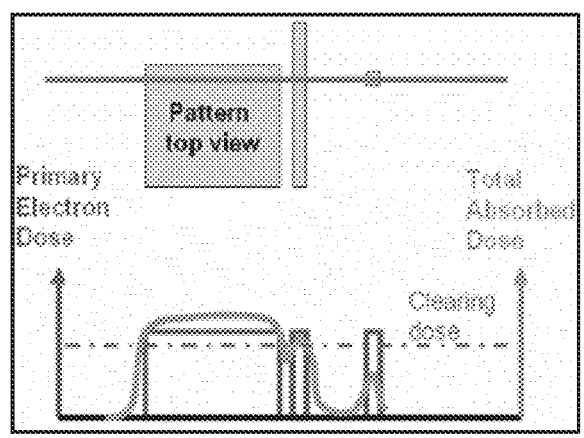
FIG. 5 is a schematic diagram of distribution of energy deposition formed after iso-dose electron beam lithography in conventional technology.
Figure 6:
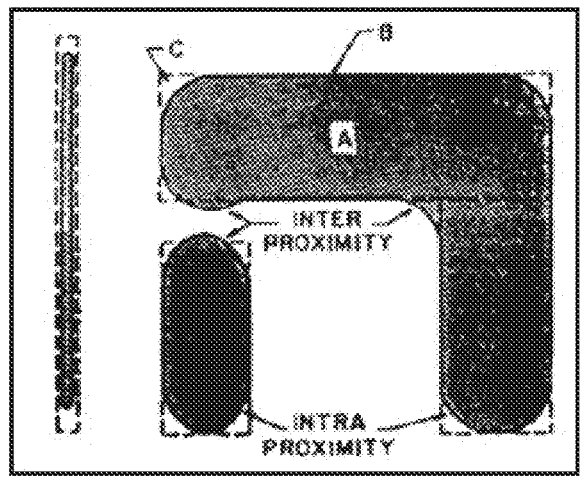
FIG. 6 is a cloud diagram showing distribution of energy deposition formed after iso-dose electron beam lithography in conventional technology.

Generally, conventional technology applies iso-electron beam-dose lithography. FIG. 5 is a schematic diagram of distribution of energy deposition formed after iso-dose electron beam lithography according to a conventional technology. FIG. 6 is a cloud diagram showing distribution of energy deposition formed after iso-dose electron-beam lithography in conventional technology. As can be seen from FIG. 5 and FIG. 6, the electron scattering effect results in non-uniform energy distribution in the photoresist, that is, distortion of the patter. A large pattern, or a region having pattern elements of a high density, has more exposed squares in it, leading to higher final energy deposition. A small pattern, or a region having pattern elements of a low density, has fewer exposed squares in it, leading to resulting in lower energy deposition. Thereby, the energy distribution is not uniform over the entire pattern, and the pattern after development distorts.

In embodiments of the present disclosure, the initial dose of the electron beam is preset for each exposed square in the grid. The proximity effect energy representing the influence of exposing all exposed squares other than the current exposed square on energy deposition at the current exposed square is calculated based on the initial dose and the point spread function. The corrected dose of the electron beam for the current exposed square is then calculated based on the proximity effect energy, the energy threshold, and the point spread function. The above two steps are repeated to calculate the corrected dose for each exposed square in the pattern matrix for electron-beam exposure. Then, for each exposed square, the updated corrected dose obtained in subsequent calculation substitutes for the corrected dose obtained in previous calculation or the initial dose, and the calculation is repeated for T times to obtain the final corrected dose of the electron beam. Central exposure energy formed by exposing the current exposed square directly to the electron beam is processed separately from the proximity effect energy at the current exposed square due to exposing surrounding exposed squares. Hence, an incident dose of the electron beam for the current exposed square may be directly calculated, simplifying computation in each step of optimizing iteration. The incident dose can be obtained with desired accuracy within few optimization iterations, and thereby an optimized dose of the electron beam is quickly solved.

Furthermore, an apparatus for correcting a proximity effect of an electron beam is provided according to an embodiment of the present disclosure. The apparatus includes a point-spread-function establishing module, a gridding module, an electron-beam initial-dose setting module, an energy-threshold determining module, a proximity-effect-energy calculating module, an electron-beam corrected-dose calculating module, and an electron-beam corrected-dose substituting module.

The point-spread-function establishing module is configured to establish a point spread function for energy distribution in a photoresist that is exposed to a unit dose of the electron beam.

The gridding module is configured to divide a designed pattern through a grid to establish a pattern matrix for electron-beam exposure, where the pattern matrix includes squares having identical dimensions, each square that is exposed in the designed pattern corresponds to a pixel value equal to 1 in the pattern matrix, and each square that is not exposed in the designed pattern corresponds to a pixel value equal to 0 in the pattern matrix.

The electron-beam initial-dose setting module is configured to determine an initial dose of the electron beam for each exposed square in the pattern matrix.

The energy-threshold determining module configured to determine an energy threshold for each exposed square in the pattern matrix.

The proximity-effect energy calculating module is configured to calculate proximity effect energy based on the point spread function and the initial dose of each exposed square, where the proximity effect energy represents an influence of exposing all exposed squares other than a current exposed square on energy deposition at the current exposed square.

The electron-beam corrected-dose calculating module is configured to: calculate a corrected dose of the electron beam for the current exposed square based on the proximity effect energy, the energy threshold, and the point spread function; and calculate the corrected dose of the electron beam for each exposed square in the pattern matrix in coordination with the proximity-effect energy calculating module.

The electron-beam corrected-dose substituting module is configured to substitute, for each exposed square, a corrected dose that is newly obtained for the initial dose or the corrected dose that is previously obtained. The electron-beam corrected-dose calculating module is further configured to perform calculation for T iterations, in coordination with the proximity-effect energy calculating module, to obtain a final corrected dose of the electron beam for each exposed square.

It should be further noted that the apparatus for correcting the proximity effect of the electron beam is not limited to the forgoing functional modules, and other modules may be applied to perform the steps in the foregoing method. In addition, each of the modules includes not only software codes for performing the functions, but also a storage medium for storing the software codes and a processor for invoking and executing the software codes read from the storage medium.

In the foregoing solution, the initial dose of the electron beam is preset for each exposed square in the grid. The proximity effect energy representing the influence of exposing all exposed squares other than the current exposed square on energy deposition at the current exposed square is calculated based on the initial dose and the point spread function. The corrected dose of the electron beam for the current exposed square is then calculated based on the proximity effect energy, the energy threshold, and the point spread function. The above two steps are repeated to calculate the corrected dose for each exposed square in the pattern matrix for electron-beam exposure. Then, for each exposed square, the updated corrected dose obtained in subsequent calculation substitutes for the corrected dose obtained in previous calculation or the initial dose, and the calculation is repeated for T times to obtain the final corrected dose of the electron beam. Central exposure energy formed by exposing the current exposed square directly to the electron beam is processed separately from the proximity effect energy at the current exposed square due to exposing surrounding exposed squares. Hence, an incident dose of the electron beam for the current exposed square may be directly calculated, simplifying computation in each step of optimizing iteration. The incident dose can be obtained with desired accuracy within few optimization iterations, and thereby an optimized dose of the electron beam is quickly solved.

Hereinabove described are only specific embodiments of the present disclosure, and the protection scope of the present disclosure is not limited thereto. Any person skilled in the art who is familiar with the technical field disclosed in the present disclosure can easily make modification or substitutions, and such modification or substitutions shall all fall within the protection scope of the present disclosure. Therefore, the protection scope of the present disclosure should be defined by what is claimed in the claims.

The invention claimed is:

1. A method for correcting a proximity effect of an electron beam, comprising:
  establishing a point spread function for energy distribution in a photoresist that is exposed to a unit dose of the electron beam;
  dividing a designed pattern through a grid to establish a pattern matrix for electron-beam exposure, wherein the pattern matrix comprises squares having identical dimensions;
  determining, for each exposed square in the pattern matrix, an initial dose of the electron beam and an energy threshold;
  calculating, for each exposed square, proximity effect energy based on the point spread function and the initial dose, wherein the proximity effect energy represents an influence of exposing all exposed squares other than said exposed square on energy deposition at said exposed square;
  calculating, for each exposed square, a corrected dose of the electron beam based on the proximity effect energy, the energy threshold, and the point spread function;
  wherein after the proximity effect energy and the corrected dose are calculated for each exposed square, the method further comprises:
  updating the corrected of the electron beam for each exposed square through a plurality of iterations to obtain a final corrected dose of the electron beam for each exposed square, wherein each of the plurality of iteration comprises:
    updating, for each exposed square, the proximity effect energy based on the point spread function and the corrected dose that is last calculated; and
    updating, for each exposed square, the corrected dose of the electron beam based on the updated proximity effect energy, the energy threshold, and the point spread function.

2. The method according to claim 1, wherein establishing the point spread function for energy distribution in the photoresist that is exposed to the electron beam of the unit dose comprises:
  using a double-Gaussian function model to establish the point spread function for a current square among the exposed squares, which is exposed as $$PSF(r) = \frac{1}{1+\eta} * \left( \frac{1}{\pi * \sigma^2} * e^{-\left(\frac{r}{\sigma}\right)^2} + \frac{\eta}{\pi * \beta^2} * e^{-\left(\frac{r}{\beta}\right)^2} \right),$$

wherein PSF(r) satisfies a normalization condition that is $\int_0^\infty PSF(r)dr = 1$ wherein σ represents a forward scattering range of the electron beam, β represents a backward scattering range of the electron beam, η represents a ratio of energy of the backward scattering to energy of the forward scattering, r represents a distance between a center point of another square in the gridded pattern and a center point of the current exposed square, and PSF(r) represents the energy distribution in a square of which a center point has a distance r from the center point of the current exposed square in the pattern matrix.

3. The method according to claim 2, wherein dividing the designed pattern through the grid to establish the pattern matrix for electron-beam exposure comprises:
  adjusting a dimension of the squares until a condition of 0.5≤PSF(0)<1 is satisfied in each exposed square.

4. The method according to claim 2, wherein calculating the proximity effect energy based on the point spread function and the initial dose of each exposed square comprises:

calculating the proximity effect energy based on the point spread function and the initial dose of each exposed square through convolution:

$$E_{ab}^{near} = \sum_{\substack{1 \le i \le m, 1 \le j \le n; \\ j \ne b, if\ i=a; \\ i \ne a, if\ j=b}} D_{ij} * PSF_{ij}(r),$$

wherein $E_{ab}^{near}$ represents the proximity effect energy corresponding to the current exposed square that is positioned at row a and column b in the pattern matrix;

$D_{ij}$ represents the initial dose or the corrected dose of a square among the squares, which is exposed and positioned at row i and column j in the pattern matrix; and $PSF_{ij}(r)$ represents a value of the point spread function for the exposed square positioned at row i and column j in the pattern matrix at a distance r representing a distance between a center of the exposed square positioned at row i and column j and the current exposed square.

5. The method according to claim 4, wherein calculating, for each exposed square, the corrected dose of the electron beam based on the proximity effect energy, the energy threshold, and the point spread function comprises:

calculating central exposure energy required at each exposed square based on the proximity effect energy and the energy threshold of said exposed square; and calculating the corrected dose for each exposed square based on the central exposure energy and the point spread function of said exposed square.

6. The method according to claim 5, wherein calculating the central exposure energy required at each exposed square based on the proximity effect energy and the energy threshold of said exposed square is based on:

$$E_{ab}^{core} = E_{ab}^{th} - E_{ab}^{near}$$

wherein $E_{ab}^{core}$ represents the central exposure energy required at said exposed square positioned at row a and column b, and $E_{ab}^{th}$ represents the energy threshold.

7. The method according to claim 6, wherein calculating the corrected dose for each exposed square based on the central exposure energy and the point spread function of sa exposed square is based on:

$$D_{ab} = E_{ab}^{core} / PSF_{ab}(0)$$

wherein $D_{ab}$ represents the corrected dose for the current exposed square positioned at row a and column b, and $PSF_{ab}(0)$ represents a local value of the point spread function of the current exposed square positioned at row a and column b, which is induced by exposing the current exposed square.

8. The method according to claim 6, wherein updating, for each exposed square, the corrected dose of the electron beam based on the updated proximity effect energy, the energy threshold, and the point spread function comprises:

updating the central exposure energy required at each exposed square based on the updated proximity effect energy and the energy threshold of said exposed square; and updating the corrected dose for each exposed square based on the updated central exposure energy and the point spread function of said exposed square; and each of the plurality of iterations further comprises:

calculating total deposited energy $E_{ab}^{opt}$ for each exposed square based on the central exposure energy and the updated proximity effect energy of said exposed square through an equation:

$$E_{ab}^{opt} = E_{ab}^{core} + E_{ab}^{near};$$

calculating a mean square error (MSE) of all exposed squares based on the total deposited energy of each exposed square and the energy threshold through an equation:

$$MSE = \frac{1}{m*n} * \sum_{1 \le i \le m, 1 \le j \le n} \left(E^{th} - E_{ij}^{opt}\right)^2;$$

determining whether the mean square error is less than a set error threshold;

performing a next one of the plurality of the iterations when it is determined that the mean square error is greater than or equal to the set error threshold; and terminating the plurality of the iterations and determining the corrected dose obtained in said iteration as the final corrected dose, when it is determined that the mean square error is less than the set error threshold.

9. The method according to claim 6, wherein in each of the plurality of iterations, the proximity effect energy for each exposed ed square is calculated through fast Fourier transfer while neglecting an influence of exposing said square on energy deposition at said square.

10. An apparatus for correcting a proximity effect of an electron beam, comprising:

a memory storing computer-readable instructions; and a processor, wherein the computer-readable instructions when executed by the processor configures the apparatus to perform;

establishing a point spread function for energy distribution in a photoresist that is exposed to a unit dose of the electron beam;

dividing a designed pattern through a grid to establish a pattern matrix for electron-beam exposure, wherein the pattern matrix comprises squares having identical dimensions;

determining for each exposed square in the pattern matrix, an initial dose of the electron beam and an energy threshold;

calculating, for each exposed square, proximity effect energy based on the point spread function and the initial dose, wherein the proximity effect energy represents an influence of exposing all exposed squares other than exposed square on energy deposition at said exposed square;

calculating, for each exposed square, a corrected dose of the electron beam based on the proximity effect energy, the energy threshold, and the point spread function, wherein after the proximity effect energy and the corrected dose are calculated for each exposed square, the method further comprises:

updating the corrected dose of the electron beam for each exposed square through a plurality of iterations to obtain a final corrected dose electron beam for each exposed square, wherein each of the plurality of iterations comprises:

calculating, for each exposed square, proximity effect energy based on the point spread function and the corrected dose that is last calculated; and calculating, for each exposed square, a corrected dose of the electron beam based on the proximity effect energy, the energy threshold, and the point spread function.

* * * * *